(12) United States Patent
Lee et al.

(10) Patent No.: US 9,164,385 B2
(45) Date of Patent: Oct. 20, 2015

(54) PHOTOSENSITIVE RESIN COMPOSITION AND LIGHT BLOCKING LAYER USING THE SAME

(71) Applicant: Cheil Industries Inc., Gumi-si (KR)

(72) Inventors: Youn-Gi Lee, Uiwang-si (KR);
Chang-Min Lee, Uiwang-si (KR);
Min-Sung Kim, Uiwang-si (KR);
Seung-Hyun Kim, Uiwang-si (KR);
Dong-Hoon Won, Uiwang-si (KR);
Seung-Jib Choi, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 14/244,113

(22) Filed: Apr. 3, 2014

(65) Prior Publication Data

US 2015/0111156 A1  Apr. 23, 2015

(30) Foreign Application Priority Data

Oct. 23, 2013  (KR) .......................... 10-2013-0126542

(51) Int. Cl.
*G03F 7/038* (2006.01)
*G03F 7/00* (2006.01)

(52) U.S. Cl.
CPC ............ *G03F 7/0388* (2013.01); *G03F 7/0007* (2013.01); *G03F 7/0384* (2013.01)

(58) Field of Classification Search
CPC ...... G03F 7/0007; G03F 7/038; G03F 7/0384
USPC .................... 430/7, 270.1, 285.1; 252/582
See application file for complete search history.

(56) References Cited

U.S. PATENT DOCUMENTS

| | | | |
|---|---|---|---|
| 2011/0151379 A1 | 6/2011 | Choi et al. | |
| 2012/0091407 A1* | 4/2012 | Lee et al. | 252/582 |
| 2012/0161088 A1* | 6/2012 | Choi et al. | 252/586 |
| 2012/0262793 A1 | 10/2012 | Yoshikawa et al. | |
| 2014/0141372 A1* | 5/2014 | Choi | 430/270.1 |
| 2014/0175343 A1* | 6/2014 | Choi et al. | 252/582 |
| 2015/0050595 A1* | 2/2015 | Kim et al. | 430/285.1 |

FOREIGN PATENT DOCUMENTS

| | | |
|---|---|---|
| JP | 2004-043573 A | 2/2004 |
| JP | 2011-170334 A | 9/2011 |
| JP | 2013-134263 A | 7/2013 |
| KR | 10-1068622 A | 6/2011 |
| KR | 10-1288564 A | 6/2011 |
| KR | 10-2012-0002372 A | 1/2012 |
| KR | 10-2012-0033892 A | 4/2012 |
| KR | 10-2012-0078495 A | 7/2012 |
| KR | 10-2012-0078513 A | 7/2012 |
| KR | 10-2012-0089914 A | 8/2012 |
| KR | 10-2012-0105570 A | 9/2012 |
| WO | 2012/044099 A2 | 4/2012 |
| WO | 2012/091401 A2 | 7/2012 |

* cited by examiner

*Primary Examiner* — Amanda C Walke
(74) *Attorney, Agent, or Firm* — Additon, Higgins & Pendleton, P.A.

(57) ABSTRACT

A photosensitive resin composition includes (A) a cardo-based resin including a repeating unit represented by the following Chemical Formula 1; (B) a reactive unsaturated compound; (C) a pigment; (D) an initiator; and (E) a solvent. A light blocking layer can be made using the same.

[Chemical Formula 1]

$$\left[ *-O \underset{R^{11}}{\overset{}{\diagdown}} O \underset{(R^{13})_{m11}}{\overset{Z^{11}}{\diagdown}} \underset{(R^{14})_{m12}}{\overset{}{\diagdown}} O \underset{R^{12}}{\overset{}{\diagdown}} O \underset{O}{\overset{COOH}{\diagdown}} \underset{COOR^5}{\overset{Z^{12}}{\diagdown}} * \right]$$

In the above Chemical Formula 1, each substituent is the same as defined in the detailed description.

12 Claims, No Drawings

PHOTOSENSITIVE RESIN COMPOSITION AND LIGHT BLOCKING LAYER USING THE SAME

CROSS-REFERENCE TO RELATED APPLICATION

This application claims priority to and the benefit of Korean Patent Application No. 10-2013-0126542 filed in the Korean Intellectual Property Office on Oct. 23, 2013, the entire disclosure of which is incorporated herein by reference.

FIELD OF THE INVENTION

This disclosure relates to a photosensitive resin composition including a cardo-based resin and a light blocking layer using the same.

BACKGROUND OF THE INVENTION

A liquid crystal display device includes a lower substrate including a color filter including a light blocking layer, a lower substrate on which an ITO pixel electrode is formed; an active circuit portion including a liquid crystal layer, a thin film transistor, and a capacitor layer; and an upper substrate on which an ITO pixel electrode is formed. The light blocking layer blocks uncontrolled light transmitted out of a transparent pixel electrode of a substrate and thus prevents contrast reduction due to light transmitted through a thin film transistor. Red, green, and blue light blocking layers transmit light with a predetermined wavelength of white light and display colors.

The light blocking layer is generally manufactured by a pigment dispersion method. The pigment dispersion method includes coating a transparent substrate with a colorant-containing photopolymerizable composition, exposing to provide a pattern by thermal curing, and removing non-exposed portions with a solvent.

However, when a photosensitive polyimide or phenol-based resin is used as a binder resin in the pigment dispersion method, high heat resistance may be obtained but sensitivity can be lowered and an organic solvent is required as a development solvent. A photoresist using an azide compound can have low sensitivity and heat resistance and may be affected by oxygen during exposure. Also, an acrylic-based resin can have good heat resistance, shrinkage-resistance, chemical resistance, and the like, but reduced sensitivity, developability, and dose contacting (adhesive) properties.

In addition, since black pigments are included in a large amount in order to adjust optical density of a light blocking layer, sensitivity, developability, and close contacting properties may significantly deteriorate.

SUMMARY OF THE INVENTION

One embodiment of the present invention provides a photosensitive resin composition that can have excellent dose contacting (adhesive) properties and/or resolution.

Another embodiment of the present invention provides a light blocking layer manufactured using the photosensitive resin composition.

The photosensitive resin composition includes: (A) a cardo-based resin including a repeating unit represented by the following Chemical Formula 1; (B) a reactive unsaturated compound; (C) a pigment; (D) an initiator; and (E) a solvent.

[Chemical Formula 1]

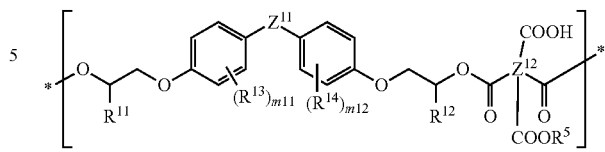

In the above Chemical Formula 1, $R^{11}$ and $R^{12}$ are the same or different and are each independently a substituent represented by the following Chemical Formula 2-1 or 2-2, $R^{13}$ and $R^{14}$ are the same or different and are each independently hydrogen, halogen, or substituted or unsubstituted C1 to C20 alkyl, $R^5$ is hydrogen or a substituent represented by the following Chemical Formula 3, $Z^{11}$ is a single bond, O, CO, $SO_2$, $CR^6R^7$, $SiR^8R^9$ (wherein $R^6$ to $R^9$ are the same or different and are each independently hydrogen or substituted or unsubstituted C1 to C20 alkyl), or one of linking groups represented by the following Chemical Formulae 4-1 to 4-11, $Z^{12}$ is an acid anhydride residual group or an acid dianhydride residual group, and m11 and m12 are the same or different and are each independently integers ranging from 0 to 4.

[Chemical Formula 2-1]

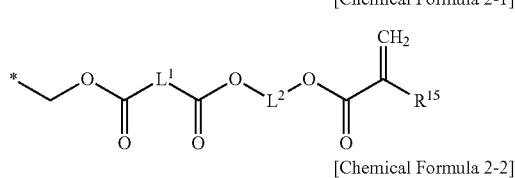

[Chemical Formula 2-2]

[Chemical Formula 3]

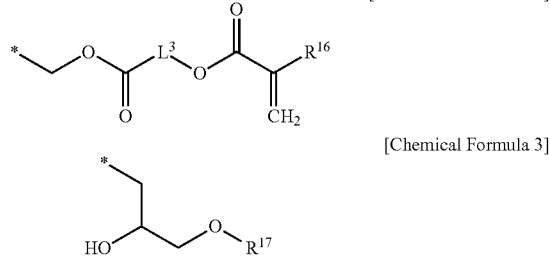

In the above Chemical Formulae 2-1 and 2-2, $L^1$ to $L^3$ are the same or different and are each independently a single bond, substituted or unsubstituted C1 to C30 alkylene, or substituted or unsubstituted C6 to C30 arylene, $R^{15}$ and $R^{16}$ are the same or different and are each independently hydrogen or substituted or unsubstituted C1 to C12 alkyl, and in the above Chemical Formula 3, $R^{17}$ is substituted or unsubstituted C1 to C30 alkyl or a substituted or unsubstituted (meth)acrylate group.

[Chemical Formula 4-1]

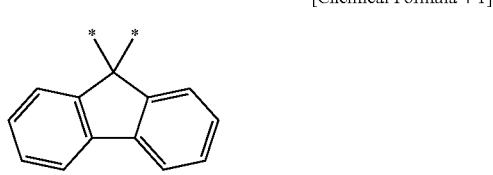

[Chemical Formula 4-2]

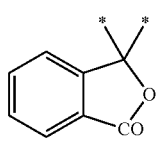

[Chemical Formula 4-3]

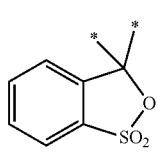

[Chemical Formula 4-4]

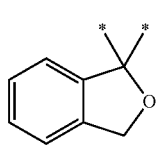

[Chemical Formula 4-5]

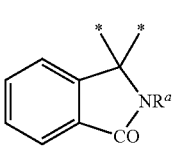

In the above Chemical Formula 4-5, $R^a$ is hydrogen, ethyl, $C_2H_4Cl$, $C_2H_4OH$, $CH_2CH=CH_2$, or phenyl.

[Chemical Formula 4-6]

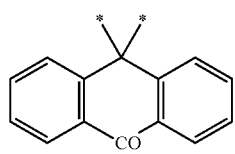

[Chemical Formula 4-7]

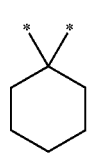

[Chemical Formula 4-8]

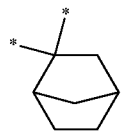

[Chemical Formula 4-9]

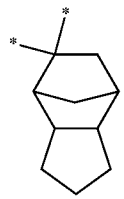

[Chemical Formula 4-10]

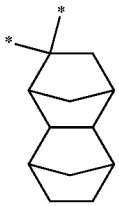

[Chemical Formula 4-11]

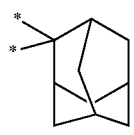

The above Chemical Formula 3 may be represented by one of the following Chemical Formulae 5-1 to 5-4.

[Chemical Formula 5-1]

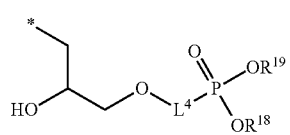

[Chemical Formula 5-2]

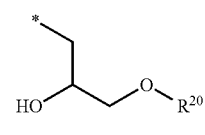

[Chemical Formula 5-3]

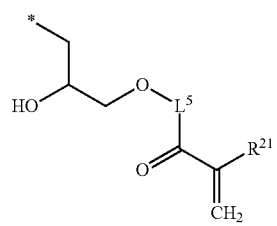

[Chemical Formula 5-4]

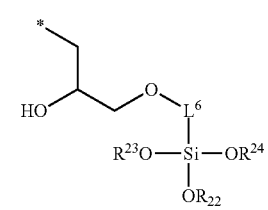

In the above Chemical Formulae 5-1 to 5-4, $L^4$ to $L^6$ are the same or different and are each independently a single bond, substituted or unsubstituted C1 to C30 alkylene, or substituted or unsubstituted C6 to C30 arylene, and $R^{18}$ to $R^{24}$ are the same or different and are each independently substituted or unsubstituted C1 to C30 alkyl.

The cardo-based resin may have a weight average molecular weight of about 500 g/mol to about 50,000 g/mol.

The cardo-based resin may include a terminal group represented by the following Chemical Formula 6 at at least one or both terminal ends.

[Chemical Formula 6]

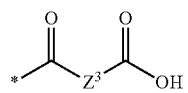

In the above Chemical Formula 6, $Z^3$ is a linking group represented by the following Chemical Formulae 7-1 to 7-7.

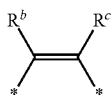

[Chemical Formula 7-1]

In the above Chemical Formula 7-1, $R^b$ and $R^c$ are the same or different and are each independently hydrogen, substituted or unsubstituted C1 to C20 alkyl, an ester group, or an ether group.

[Chemical Formula 7-2]

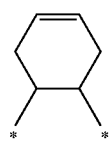

[Chemical Formula 7-3]

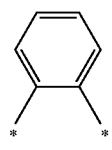

[Chemical Formula 7-4]

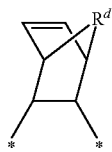

[Chemical Formula 7-5]

In the above Chemical Formula 7-5, $R^d$ is O, S, NH, substituted or unsubstituted C1 to C20 alkylene, C1 to C20 alkylamine group, or C2 to C20 allylamine group.

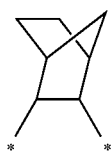

[Chemical Formula 7-6]

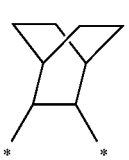

[Chemical Formula 7-7]

The photosensitive resin composition may include about 1 wt % to about 30 wt % of the cardo-based resin (A); about 1 wt % to about 40 wt % of the reactive unsaturated compound (B); about 1 wt % to about 50 wt % of the pigment (C); about 0.01 wt % to about 10 wt % of the initiator (D); and a balance amount of the solvent (E).

The photosensitive resin composition may further include an acrylic-based resin.

The acrylic-based resin may be a copolymer of a first ethylenic unsaturated monomer including (meth)acrylic acid, maleic acid, itaconic acid, fumaric acid, or a combination thereof; and a second ethylenic unsaturated monomer including styrene, α-methylstyrene, vinyltoluene, vinylbenzylmethylether, methyl(meth)acrylate, ethyl(meth)acrylate, butyl (meth)acrylate, 2-hydroxyethyl(meth)acrylate, 2-hydroxy butyl(meth)acrylate, benzyl(meth)acrylate, cyclohexyl (meth)acrylate, phenyl(meth)acrylate, 2-aminoethyl(meth) acrylate, 2-dimethylaminoethyl(meth)acrylate, vinyl acetate, vinyl benzoate, glycidyl(meth)acrylate, (meth)acrylonitrile, (meth)acrylamide, or a combination thereof.

The acrylic-based resin may have a weight average molecular weight of about 3,000 g/mol to about 40,000 g/mol.

The cardo-based resin and the acrylic-based resin may be included in a weight ratio of about 99:1 to about 30:70.

The initiator may be a photopolymerization initiator, a radical polymerization initiator, or a combination thereof.

The photosensitive resin composition may further include about 0.01 parts by weight to about 20 parts by weight of an epoxy compound based on about 100 parts by weight of the photosensitive resin composition.

The present invention also provides a light blocking layer manufactured using the photosensitive resin composition.

The photosensitive resin composition can have close contacting (adhesive) properties and/or resolution and may be usefully applied to a light blocking layer, and the like.

DETAILED DESCRIPTION

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "alkyl" refers to C1 to C20 alkyl, the term "alkenyl" refers to C2 to C20 alkenyl, the term "cycloalkenyl" refers to C3 to C20 cycloalkenyl, the term "heterocycloalkenyl" refers to C3 to C20 heterocycloalkenyl, the term "aryl" refers to C6 to C20 aryl, the term "arylalkyl" refers to C6 to C20 arylalkyl, the term "alkylene" refers to C1 to C20 alkylene, the term "arylene" refers to C6 to C20 arylene, the term "alkylarylene" refers to C6 to C20 alkylarylene, the term "heteroarylene" refers to C3 to C20 heteroarylene, and the term "alkoxylene" refers to C1 to C20 alkoxylene.

As used herein, when a specific definition is not otherwise provided, the term "substituted" refers to one substituted with a substituent including halogen (F, Cl, Br, or I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a silyl group, a carboxyl group or a salt thereof, a sulfonic acid group or a salt thereof, phosphoric acid or a salt thereof such as a phosphonic acid, and the like, C1 to C20 alkyl, C2 to C20 alkenyl, C2 to C20 alkynyl, C6 to C20 aryl, C3 to C20 cycloalkyl, C3 to C20 cycloalkenyl, C3 to C20 cycloalkynyl, C2 to C20 heterocycloalkyl, C2 to C20 heterocycloalkenyl, C2 to C20 heterocycloalkynyl, C3 to C20 heteroaryl, or a combination thereof, instead of at least one hydrogen.

As used herein, when a specific definition is not otherwise provided, the term "hetero" refers to one including at least one heteroatom including N, O, S and/or P in a chemical formula.

As used herein, when a specific definition is not otherwise provided, "(meth)acrylate" refers to both "acrylate" and "methacrylate," and "(meth)acrylic acid" refers to "acrylic acid" and "methacrylic acid."

As used herein, when a specific definition is not otherwise provided, the term "combination" refers to a mixture or a copolymerization.

As used herein, unless a specific definition is otherwise provided, a hydrogen atom is bonded at a position when a chemical bond is not drawn.

As used herein, when a specific definition is not otherwise provided, "*" indicates a point where the same or different atom or chemical formula is linked.

A photosensitive resin composition according to one embodiment includes (A) a cardo-based resin, (B) a reactive unsaturated compound, (C) a pigment, (D) an initiator, and (E) a solvent. The cardo-based resin includes a substituent represented by the following Chemical Formula 2-1 or 2-2, and may also include one or more of substituents represented by the following Chemical Formula 3, such as one or more substituents represented by Formulae 5-1 to 5-4. The adhesive (close-contacting) force of the photosensitive resin composition to a substrate may be improved, and excellent resolution may be realized.

Hereinafter, each component is specifically described.

(A) Cardo-Based Resin

The cardo-based resin includes a repeating unit represented by the following Chemical Formula 1.

[Chemical Formula 1]

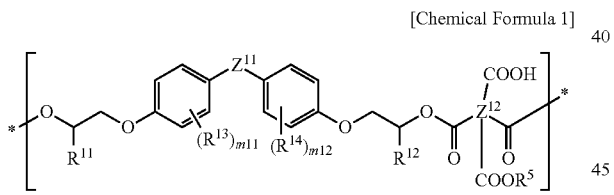

In the above Chemical Formula 1, $R^{11}$ and $R^{12}$ are the same or different and are each independently a substituent represented by the following Chemical Formula 2-1 or 2-2, $R^{13}$ and $R^{14}$ are the same or different and are each independently hydrogen, halogen, or substituted or unsubstituted C1 to C20 alkyl.

$R^5$ is hydrogen or a substituent represented by the following Chemical Formula 3, $Z^{11}$ is a single bond, O, CO, $SO_2$, $CR^6R^7$, $SiR^8R^9$ (wherein $R^6$ to $R^9$ are the same or different and are each independently hydrogen or substituted or unsubstituted C1 to C20 alkyl), or one of linking groups represented by the following Chemical Formulae 4-1 to 4-11, $Z^{12}$ is an acid anhydride residual group or an acid dianhydride residual group, and m11 and m12 are the same or different and are each independently integers ranging from 0 to 4.

[Chemical Formula 2-1]

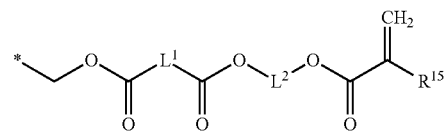

[Chemical Formula 2-2]

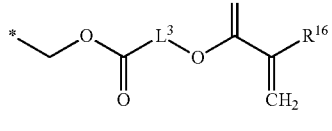

[Chemical Formula 3]

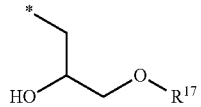

In the above Chemical Formulae 2-1 and 2-2, $L^1$ to $L^3$ are the same or different and are each independently a single bond, substituted or unsubstituted C1 to C30 alkylene, or substituted or unsubstituted C6 to C30 arylene, $R^{15}$ and $R^{16}$ are the same or different and are each independently hydrogen or substituted or unsubstituted C1 to C12 alkyl, and in the above Chemical Formula 3, $R^{17}$ is substituted or unsubstituted C1 to C30 alkyl or a substituted or unsubstituted (meth)acrylate group.

[Chemical Formula 4-1]

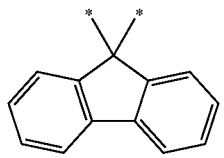

[Chemical Formula 4-2]

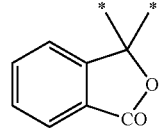

[Chemical Formula 4-3]

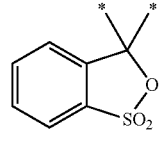

[Chemical Formula 4-4]

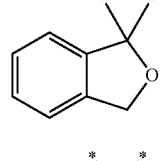

[Chemical Formula 4-5]

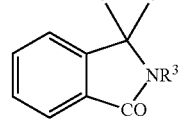

In the above Chemical Formula 4-5, $R^a$ is hydrogen, ethyl, $C_2H_4Cl$, $C_2H_4OH$, $CH_2CH=CH_2$, or phenyl.

[Chemical Formula 4-6]
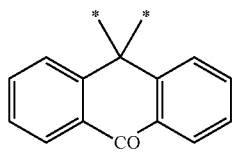

[Chemical Formula 4-7]
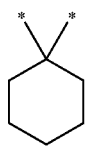

[Chemical Formula 4-8]
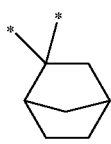

[Chemical Formula 4-9]
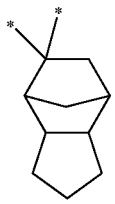

[Chemical Formula 4-10]
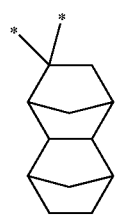

[Chemical Formula 4-11]
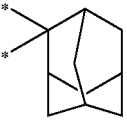

The repeating unit represented by the above Chemical Formula 1 includes a substituent represented by the above Chemical Formula 2-1 or 2-2 at a position indicated as $R^{11}$ and $R^{12}$ and may include a substituent represented by the above Chemical Formula 3 at a position indicated as $R^5$ and accordingly, may improve a close-contacting (adhesive) force of a photosensitive resin composition with a substrate and thus, resolution.

The above Chemical Formula 3 may be represented by one selected from the following Chemical Formulae 5-1 to 5-4.

[Chemical Formula 5-1]
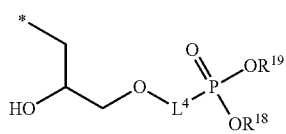

[Chemical Formula 5-2]
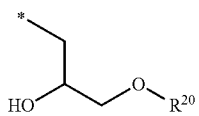

[Chemical Formula 5-3]
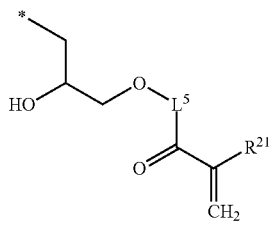

[Chemical Formula 5-4]
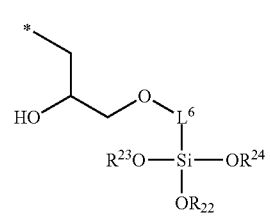

In the above Chemical Formulae 5-1 to 5-4,
$L^4$ to $L^6$ are the same or different and are each independently a single bond, substituted or unsubstituted C1 to C30 alkylene, or substituted or unsubstituted C6 to C30 arylene, and
$R^{18}$ to $R^{24}$ are the same or different and are each independently substituted or unsubstituted C1 to C30 alkyl.

The cardo-based resin may include a terminal group represented by the following Chemical Formula 6 at at least one or both terminal ends.

[Chemical Formula 6]
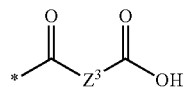

In the above Chemical Formula 6,
$Z^3$ is a linking group represented by the following Chemical Formulae 7-1 to 7-7.

[Chemical Formula 7-1]
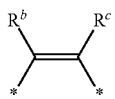

In the above Chemical Formula 7-1,
$R^b$ and $R^c$ are the same or different and are each independently hydrogen, substituted or unsubstituted C1 to C20 alkyl, an ester group, or an ether group.

[Chemical Formula 7-2]
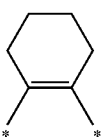

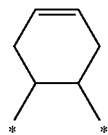
[Chemical Formula 7-3]

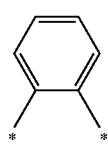
[Chemical Formula 7-4]

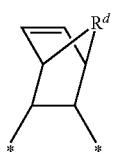
[Chemical Formula 7-5]

In the above Chemical Formula 7-5.

R$^d$ is O, S, NH, substituted or unsubstituted C1 to C20 alkylene, C1 to C20 alkylamine group, or C2 to C20 allylamine group.

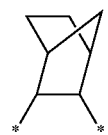
[Chemical Formula 7-6]

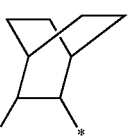
[Chemical Formula 7-7]

The cardo-based resin may be prepared by mixing at least two of a fluorine-containing compound such as 9,9-bis(4-oxiranyl methoxyphenyl)fluorine, and the like; an anhydride compound such as benzene tetracarboxylic acid dianhydride, naphthalene tetracarboxylic acid dianhydride, biphenyl tetracarboxylic acid dianhydride, benzophenone tetracarboxylic acid dianhydride, pyromellitic dianhydride, cyclobutane tetracarboxylic acid dianhydride, perylene tetracarboxylic acid dianhydride, tetrahydrofuran tetracarboxylic acid dianhydride, tetrahydrophthalic anhydride, and the like; a glycol compound such as ethylene glycol, propylene glycol, polyethylene glycol and the like; an alcohol compound such as methanol, ethanol, propanol, n-butanol, cyclohexanol, benzylalcohol, and the like; a solvent compound such as propylene glycol methylethylacetate, N-methylpyrrolidone, and the like; a phosphorus compound such as triphenylphosphine, and the like; and an amine or ammonium salt compound such as tetramethylammonium chloride, tetraethylammonium bromide, benzyldiethylamine, triethylamine, tributylamine, benzyttriethylammonium chloride, and the like.

The cardo-based resin may have a weight average molecular weight of about 500 g/mol to about 50,000 g/mol, for example about 1,000 g/mol to about 30,000 g/mol. When the cardo-based resin has a weight average molecular weight within the above range, a pattern may be well formed without a residue during manufacture of a light blocking layer and without loss of a film thickness during development.

The photosensitive resin composition may include the cardo-based resin in an amount of about 1 wt % to about 30 wt %, for example about 3 wt % to about 20 wt %, based on the total amount (total weight or 100 wt %) of the photosensitive resin composition. In some embodiments, the photosensitive resin composition may include the cardo-based resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the cardo-based resin can be in a range from about any of the foregoing amounts to about any other of the foregoing amounts.

When the cardo-based resin is included in an amount within the above range, excellent sensitivity, developability and/or close contacting properties may be obtained.

The photosensitive resin composition may further include an acrylic-based resin in addition to the cardo-based resin. The acrylic-based resin is a copolymer of a first ethylenic unsaturated monomer and a second ethylenic unsaturated monomer that is copolymerizable therewith, and is a resin including at least one acrylic-based repeating unit.

The first ethylenic unsaturated monomer is an ethylenic unsaturated monomer including at least one carboxyl group. Examples of the monomer include without limitation (meth)acrylic acid, maleic acid, itaconic acid, fumaric acid, and the like, and combinations thereof.

The acrylic-based resin may include the first ethylenic unsaturated monomer in an amount of about 5 wt % to about 50 wt %, for example about 10 wt % to about 40 wt %, based on the total amount (total weight or 100 wt %) of the acrylic-based resin.

Examples of the second ethylenic unsaturated monomer may include without limitation aromatic vinyl compounds such as styrene, α-methylstyrene, vinyl toluene, vinylbenzyl-methylether and the like; unsaturated carboxylate ester compounds such as methyl(meth)acrylate, ethyl(meth)acrylate, butyl(meth)acrylate, 2-hydroxyethyl(meth)acrylate, 2-hydroxybutyl(meth)acrylate, benzyl(meth)acrylate, cyclohexyl (meth)acrylate, phenyl(meth)acrylate, and the like; unsaturated carboxylic acid amino alkyl ester compounds such as 2-aminoethyl(meth)acrylate, 2-dimethylaminoethyl(meth)acrylate, and the like; carboxylic acid vinyl ester compounds such as vinyl acetate, vinyl benzoate, and the like; unsaturated carboxylic acid glycidyl ester compounds such as glycidyl (meth)acrylate, and the like; vinyl cyanide compounds such as (meth)acrylonitrile and the like; unsaturated amide compounds such as (meth)acrylamide, and the like; and the like, and may be used singularly or as a mixture of two or more.

Specific examples of the acrylic-based resin may include without limitation an acrylic acid/benzylmethacrylate copolymer, a methacrylic acid/benzylmethacrylate copolymer, a methacrylic acid/benzylmethacrylate/styrene copolymer, a methacrylic acid/benzylmethacrylate/2-hydroxyethylmethacrylate copolymer, a methacrylic acid/benzylmethacrylate/styrene/2-hydroxyethylmethacrylate copolymer, and the like. These may be used singularly or as a mixture of two or more.

The acrylic-based resin may have a weight average molecular weight of about 3,000 g/mol to about 40,000 g/mol, for example about 5,000 g/mol to about 30,000 g/mol. When the acrylic-based resin has a weight average molecular weight within the above range, the photosensitive resin composition may have excellent physical and/or chemical properties and/or an appropriate viscosity, maintain appropriate developability and/or sensitivity, and/or show an excellent close-contacting force to a substrate during manufacture of a light blocking layer.

The acrylic-based resin may have an acid value ranging from about 20 mgKOH/g to about 200 mgKOH/g, for example about 50 mgKOH/g to about 150 mgKOH/g. When the acrylic-based resin has an acid value within the above range, a pixel pattern may maintain developability and thus may have excellent resolution.

When the acrylic-based resin is included in the photosensitive resin composition, the cardo-based resin and the acrylic-based resin may be used in a weight ratio ranging from about 99:1 to about 30:70, for example, about 95:5 to about 50:50.

In some embodiments, the cardo-based resin and the acrylic-based resin may include the cardo-based resin in an amount of about 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, or 99 wt %. Further, according to some embodiments of the present invention, the amount of the cardo-based resin can be in a range from about any of the foregoing amounts to about any other of the foregoing amounts.

In some embodiments, the cardo-based resin and the acrylic-based resin may include the acrylic-based resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, or 70 wt %. Further, according to some embodiments of the present invention, the amount of the acrylic-based resin can be in a range from about any of the foregoing amounts to about any other of the foregoing amounts.

When the cardo-based resin and acrylic-based resin are included in amounts within the above weight ratio range, a light blocking layer pattern having excellent tapering characteristics as well as maintaining excellent developability and sensitivity may be formed, and an undercut may also be prevented.

(B) Reactive Unsaturated Compound

The reactive unsaturated compound may be a generally-used monomer and/or oligomer in a photosensitive resin composition. The reactive unsaturated compound may include a mono-functional and/or multi-functional ester of (meth) acrylic acid including at least one ethylenic unsaturated double bond.

The reactive unsaturated compound has an ethylenic unsaturated double bond and thus may cause sufficient polymerization during exposure in a pattern-forming process and form a pattern having excellent heat resistance, light resistance, and/or chemical resistance.

Examples of the reactive unsaturated compound may include without limitation ethylene glycol diacrylate, ethylene glycol dimethacrylate, diethylene glycol diacrylate, triethylene glycol diacrylate, triethylene glycol dimethacrylate, 1,6-hexanediol diacrylate, 1,6-hexanediol dimethacrylate, pentaerythritol triacrylate, pentaerythritol tetraacrylate, dipentaerythritol pentaacrylate, dipentaerythritol hexaacrylate, bisphenol A epoxyacrylate, ethylene glycolmonomethylether acrylate, trimethylolpropane triacrylate, trisacryloyloxyethyl phosphate, and the like, and combinations thereof.

Commercially available examples of the photopolymerizable monomer include the following. The mono-functional (meth)acrylic acid ester may include without limitation Aronix M-101®, M-111®, and/or M-114® (TOAGOSEI CHEMICAL INDUSTRY Co., Ltd.); KAYARAD TC-110S® and/or TC-120S® (NIPPON KAYAKU Co., Ltd.); V-158® and/or V-2311® (OSAKA ORGANIC CHEMICAL IND., Ltd.), and the like. Examples of a difunctional (meth)acrylic acid ester may include without limitation Aronix M-210®, M-240®, and/or M-6200® (TOAGOSEI CHEMICAL INDUSTRY Co., Ltd.). KAYARAD HDDA®, HX-220®, and/or R-604® (NIPPON KAYAKU Co., Ltd.), V-260®, V-312®, and/or V-335 HP® (OSAKA ORGANIC CHEMICAL IND., Ltd.), and the like. Examples of a tri-functional (meth)acrylic acid ester may include without limitation Aronix M-309®, M-400®, M-405®, M-450®, M-7100®, M-8030®, and/or M-8060® (TOAGOSEI CHEMICAL INDUSTRY Co., Ltd.), KAYARAD TMPTA®, DPCA-20®, DPCA-30®, DPCA-60®, and/or DPCA-120® (NIPPON KAYAKU Co., Ltd.), V-295®, V-300®, V-360®, V-GPT®, V-3PA®, and/or V-400® (Osaka Yuki Kayaku Kogyo Co. Ltd.), and the like. These may be used singularly or as a mixture of two or more.

The reactive unsaturated compound may be treated with acid anhydride to improve developability.

The photosensitive resin composition may include the reactive unsaturated compound in an amount of about 1 wt % to about 40 wt %, for example about 1 wt % to about 20 wt %, based on the total amount (total weight or 100 wt %) of the photosensitive resin composition. In some embodiments, the photosensitive resin composition may include the reactive unsaturated compound in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the reactive unsaturated compound can be in a range from about any of the foregoing amounts to about any other of the foregoing amounts.

When the reactive unsaturated compound is included in an amount within the above range, the reactive unsaturated compound can be sufficiently cured during exposure in a pattern-forming process and can have excellent reliability and thus, may form a pattern having excellent heat resistance, light resistance, and/or chemical resistance and also, excellent resolution and/or close contacting property.

(C) Pigment

The pigment may include an organic pigment and/or an inorganic pigment.

Examples of the pigment may include without limitation red pigments, green pigments, blue pigments, yellow pigments, black pigments and the like, and combinations thereof.

Examples of the red pigment may include without limitation C.I. red pigment 254, C.I. red pigment 255, C.I. red pigment 264, C.I. red pigment 270, C.I. red pigment 272, C.I. red pigment 177, C.I. red pigment 89, and the like and combinations thereof. Examples of the green pigment may include without limitation halogen-substituted copper phthalocyanine pigments such as C.I. green pigment 36, C.I. green pigment 7, and the like and combinations thereof. Examples of the blue pigment may include without limitation copper phthalocyanine pigments such as C.I. blue pigment 15:6, C.I. blue pigment 15, C.I. blue pigment 15:1, C.I. blue pigment 15:2, C.I. blue pigment 15:3, C.I. blue pigment 15:4. C.I. blue pigment 15:5, C.I. blue pigment 16, and the like and combinations thereof. Examples of the yellow pigment may include without limitation isoindoline-based pigments such as C.I. yellow pigment 139, and the like, quinophthalone-based pigments such as C.I. yellow pigment 138, and the like, nickel complex pigments such as C.I. yellow pigment 150, and the like and combinations thereof. Examples of the black pigment may include without limitation aniline black, perylene black, titanium black, carbon black, and the like and combinations thereof. The pigment may be used singularly or as a mixture of two or more, but is not limited thereto.

Among these pigments, the black pigment may be used to perform efficient light blocking of a light blocking layer. The black pigment may be used with a color calibrator such as an anthraquinone-based pigment, a perylene-based pigment, a phthalocyanine-based pigment, an azo-based pigment, and the like and combinations thereof.

The photosensitive resin composition may further include a dispersing agent in order to improve dispersion of the pigment. The pigment may be surface-pretreated with a dispersing agent, or the pigment and dispersing agent may be added together during preparation of the photosensitive resin composition.

Examples of the dispersing agent may include without limitation non-ionic dispersing agents, anionic dispersing agents, cationic dispersing agents, and the like, and combinations thereof. Specific examples of the dispersing agent may include without limitation polyalkylene glycols and esters thereof, polyoxyalkylenes, polyhydric alcohol ester alkylene oxide addition products, alcohol alkylene oxide addition products, sulfonate esters, sulfonate salts, carboxylate esters, carboxylate salts, alkylamide alkylene oxide addition products, alkyl amines, and the like, and may be used singularly or as a mixture of two or more.

Commercially available examples of the dispersing agent may include without limitation DISPERBYK-101, DISPERBYK-130. DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001, and the like made by BYK Co., Ltd.; EFKA-47, EFKA-47EA, EFKA-48, EFKA-49, EFKA-100, EFKA-400, EFKA-450, and the like made by EFKA Chemicals Co.; Solsperse 5000, Solsperse 12000, Solsperse 13240, Solsperse 13940, Solsperse 17000, Solsperse 20000, Solsperse 24000GR, Solsperse 27000, Solsperse 28000, and the like made by Zeneka Co.; or PB711, PB821, and the like made by Ajinomoto Inc., and combinations thereof.

The dispersing agent may be included in an amount of about 0.1 wt % to about 15 wt % based on the total weight of the photosensitive resin composition. When the dispersing agent is included in an amount within the above range, the photosensitive resin composition may have an excellent dispersion property and thus may form a light blocking layer having excellent stability, developability, and/or pattern-forming capability.

The pigment may be pre-treated using a water-soluble inorganic salt and a wetting agent. When the pigment is pre-treated, a primary particle of the pigment may become finer.

The pre-treatment may be performed by kneading the pigment with a water-soluble inorganic salt and a wetting agent and then filtering and washing the kneaded pigment.

The kneading may be performed at a temperature ranging from about 40° C. to about 100° C. and the filtering and washing may be performed by filtering the pigment after washing away an inorganic salt with water and the like.

Examples of the water-soluble inorganic salt may include without limitation sodium chloride, potassium chloride, and the like. The wetting agent may make the pigment to be uniformly mixed with the water-soluble inorganic salt uniformly and be pulverized. Examples of the wetting agent may include without limitation alkylene glycol monoalkyl ethers such as ethylene glycol monoethylether, propylene glycol monomethylether, diethylene glycol monomethylether, and the like, and alcohols such as ethanol, isopropanol, butanol, hexanol, cyclohexanol, ethylene glycol, diethylene glycol, polyethylene glycol, glycerine polyethylene glycol, and the like. These may be used singularly or as a mixture of two or more.

The pigment after the kneading may have an average particle diameter ranging from about 30 nm to about 100 nm. When the pigment has an average particle diameter within the above range, a fine pattern having excellent heat resistance and/or light resistance may be effectively formed.

The photosensitive resin composition may include the pigment in an amount of about 1 wt % to about 50 wt %, for example, about 2 wt % to about 45 wt %, based on the total amount (total weight or 100 wt %) of the photosensitive resin composition. In some embodiments, the photosensitive resin composition may include the pigment in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the pigment can be in a range from about any of the foregoing amounts to about any other of the foregoing amounts.

When the pigment is included in an amount within the above range, a pattern having excellent color reproducibility, curing property, and/or close contacting property may be obtained.

(D) Initiator

The initiator may be a photopolymerization initiator, a radical polymerization initiator, or a combination thereof.

The photopolymerization initiator may be a generally-used photopolymerization initiator in a photosensitive resin composition. Examples of the photopolymerization initiator may include without limitation acetophenone-based compounds, benzophenone-based compounds, thioxanthone-based compounds, benzoin-based compounds, oxime-based compounds, and the like, and combinations thereof.

Examples of the acetophenone-based compound may include without limitation 2,2'-diethoxy acetophenone, 2,2'-dibutoxy acetophenone, 2-hydroxy-2-methylpropiophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like and combinations thereof.

Examples of the benzophenone-based compound may include without limitation benzophenone, benzoyl benzoate, methyl benzoyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like and combinations thereof.

Examples of the thioxanthone-based compound may include without limitation thioxanthone, 2-methylthioxanthone, isopropyl thioxanthone, 2,4-diethyl thioxanthone, 2,4-diisopropyl thioxanthone, 2-chlorothioxanthone, and the like and combinations thereof.

Examples of the benzoin-based compound may include without limitation benzoin, benzoin methyl ether, benzoin ethyl ether, benzoin isopropyl ether, benzoin isobutyl ether, benzyldimethylketal, and the like and combinations thereof.

Examples of the triazine-based compound may include without limitation 2,4,6-trichloro-s-triazine, 2-phenyl-4,6-bis(trichloromethyl)-s-triazine, 2-(3',4'-dimethoxystyryl)-4, 6-bis(trichloromethyl)-s-triazine, 2-(4'-methoxynaphthyl)-4, 6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl-4,6-bis(trichloro methyl)-s-triazine, bis(trichloromethyl)-6-styryl-s-triazine, 2-(naphtho1-yl)-4,6-bis(trichloromethyl)-s-triazine, 2-(4-methoxynaphtho1-yl)-4,6-bis(trichloromethyl)-s-triazine, 2-4-bis (tri chloromethyl)-6-piperonyl-s-triazine, 2-4-bis (trichloromethyl)-6-(4-methoxystyryl)-s-triazine, and the like and combinations thereof.

Examples of the oxime-based compound may include without limitation O-acyloxime-based compounds, 2-(O-benzoyloxime)-1-[4-(phenylthio)phenyl]-1,2-octandione, 1-(O-acetyloxime)-1-[9-ethyl-6-(2-methylbenzoyl)-9H-carbazol-3-yl]ethanone, O-ethoxycarbonyl-α-oxyamino-1-phenylpropan-1-one, and the like and combinations thereof. Examples of the O-acyloxime-based compound may include without limitation 1,2-octandione, 2-dimethylamino-2-(4-methylbenzyl)-1-(4-morpholin-4-yl-phenyl)-butan-1-one, 1-(4-phenylsulfanyl phenyl)-butane-1,2-dione 2-oxime-O-benzoate, 1-(4-phenylsulfanyl phenyl)-octane-1,2-dione2-oxime-O-benzoate, 1-(4-phenylsulfanyl phenyl)-octan-1-one oxime-O-acetate, 1-(4-phenylsulfanyl phenyl)-butan-1-one oxime-O-acetate, and the like and combinations thereof.

The photopolymerization initiator may further include a carbazole-based compound, a diketone-based compound, a sulfonium borate-based compound, a diazo-based compound, an imidazole-based compound, a biimidazole-based compound, and the like and combinations thereof in addition to or as an alternative to the above photopolymerization initiators.

Examples of the radical polymerization initiator may include without limitation peroxide-based compounds, azobis-based compounds, and the like, and combinations thereof.

Examples of the peroxide-based compound may include without limitation ketone peroxides such as methylethylketone peroxide, methylisobutylketone peroxide, cyclohexanone peroxide, methylcyclohexanone peroxide, acetylacetone peroxide, and the like; diacyl peroxides such as isobutyryl peroxide, 2,4-dichlorobenzoyl peroxide, o-methylbenzoyl peroxide, bis-3,5,5-trimethylhexanoyl peroxide, and the like; hydro peroxides such as 2.4.4,-trimethylpentyl-2-hydro peroxide, diisopropylbenzenehydro peroxide, cumenehydro peroxide, t-butylhydro peroxide, and the like; dialkyl peroxides such as dicumyl peroxide, 2,5-dimethyl-2,5-di(t-butylperoxy)hexane, 1,3-bis(t-butyloxyisopropyl)benzene, t-butylperoxyvaleric acid n-butylester, and the like; alkyl peresters such as 2,4,4-trimethylpentyl peroxyphenoxyacetate, α-cumyl peroxyneodecanoate, t-butyl peroxybenzoate, di-t-butyl peroxytrimethyladipate, and the like; percarbonates such as di-3-methoxybutyl peroxydicarbonate, di-2-ethylhexyl peroxydicarbonate, bis-4-t-butylcyclohexyl peroxydicarbonate, diisopropyl peroxydicarbonate, acetylcyclohexylsulfonyl peroxide, t-butyl peroxyarylcarbonate and the like; and the like and combinations thereof.

Examples of the azobis-based compound may include without limitation 1,1'-azobiscyclohexane-1-carbonitrile, 2,2'-azobis(2,4-dimethylvaleronitrile), 2,2,-azobis(methylisobutyrate), 2,2'-azobis(4-methoxy-2,4-dimethylvaleronitrile), α,α'-azobis(isobutylnitrile), 4,4'-azobis(4-cyanovaleric acid), and the like and combinations thereof.

The initiator may be used with a photosensitizer capable of causing a chemical reaction by absorbing light and becoming excited and then transferring its energy.

Examples of the photosensitizer may include without limitation tetraethylene glycol bis-3-mercapto propionate, pentaerythritol tetrakis-3-mercapto propionate, dipentaerythritol tetrakis-3-mercapto propionate, and the like and combinations thereof.

The photosensitive resin composition may include the initiator in an amount of about 0.01 wt % to about 10 wt %, for example about 0.1 wt % to about 5 wt %, based on the total amount (total weight or 100 wt %) of the photosensitive resin composition. In some embodiments, the photosensitive resin composition may include the initiator in an amount of about 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the initiator can be in a range from about any of the foregoing amounts to about any other of the foregoing amounts.

When the initiator is included in an amount within the above range, excellent reliability may be secured due to sufficiently curing during exposure in a pattern-forming process, a pattern may have excellent resolution and close contacting property as well as excellent heat resistance, light resistance, and/or chemical resistance, and transmittance may be prevented from deterioration due to a non-reaction initiator.

(E) Solvent

The solvent is a material having compatibility with the cardo-based resin, the reactive unsaturated compound, the pigment, and the initiator but not reactive therewith.

Examples of the solvent may include without limitation alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactate esters such as methyl lactate, ethyl lactate, and the like; oxy acetic acid alkyl esters such as oxy methyl acetate, oxy ethyl acetate, butyl oxyacetate, and the like; alkoxy acetic acid alkyl esters such as methoxy methyl acetate, methoxy ethyl acetate, methoxy butyl acetate, ethoxy methyl acetate, ethoxy ethyl acetate, and the like; 3-oxy propionic acid alkyl esters such as 3-oxy methyl propionate, 3-oxy ethyl propionate, and the like; 3-alkoxy propionic acid alkyl esters such as 3-methoxy methyl propionate, 3-methoxy ethyl propionate, 3-ethoxy ethyl propionate, 3-ethoxy methyl propionate, and the like; 2-oxy propionic acid alkyl esters such as 2-oxy methyl propionate, 2-oxy ethyl propionate, 2-oxy propyl propionate, and the like; 2-alkoxy propionic acid alkyl esters such as 2-methoxy methyl propionate, 2-methoxy ethyl propionate, 2-ethoxy ethyl propionate, 2-ethoxy methyl propionate, and the like; 2-oxy-2-methyl propionic acid esters such 2-oxy-2-methyl methyl propionate, 2-oxy-2-methyl ethyl propionate, and the like, monooxy monocarboxylic acid alkyl esters of 2-alkoxy-2-methyl alkyl propionates such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-hydroxy-3-methyl methyl butanoate, and the like; ketonate esters such as ethyl pyruvate, and the like and combinations thereof. Additionally, high boiling point solvents such as N-methylformamide, N,N-dimethylformamide, N-methylformanilide, N-methylacetamide, N,N-dimethylacetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like and combinations thereof may be also used.

Considering miscibility and reactivity, glycol ethers such as ethylene glycol monoethylether, and the like; ethylene glycol alkylether acetates such as ethyl cellosolve acetate, and the like; esters such as 2-hydroxy ethyl propionate, and the like; carbitols such as diethylene glycol monomethylether, and the like; propylene glycol alkylether acetates such as propylene glycol methylether acetate, propylene glycol propylether acetate and the like and combinations thereof may be used.

The photosensitive resin composition may include the solvent in a balance amount, for example about 40 wt % to about 90 wt %, based on the total amount (total weight or 100 wt %) of the photosensitive resin composition. In some embodiments, the photosensitive resin composition may include the solvent in an amount of about 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the solvent can be in a range from about any of the foregoing amounts to about any other of the foregoing amounts.

When the solvent is included in an amount within the above range, the photosensitive resin composition may have an appropriate viscosity resulting in improvement of coating characteristics of a light blocking layer.

(F) Other Additive(s)

The photosensitive resin composition may further include an epoxy compound to improve close contacting (adhesive) property with a substrate and the like.

Examples of the epoxy compound may include without limitation phenol novolac epoxy compounds, tetramethyl biphenyl epoxy compounds, bisphenol A epoxy compounds, alicyclic epoxy compounds, and the like, and combinations thereof.

The epoxy compound may be included in an amount of about 0.01 parts by weight to about 20 parts by weight, for example, about 0.1 parts by weight to about 10 parts by weight, based on about 100 parts by weight of the photosensitive resin composition. When the epoxy compound is included in an amount within the above range, a close contacting property, a storage property, and the like may be improved.

In addition, the photosensitive resin composition may further include a silane coupling agent having a reactive substituent such as a carboxyl group, a methacryloyl group, an isocyanate group, an epoxy group, and the like to improve its adherence to a substrate.

Examples of the silane-based coupling agent may include without limitation trimethoxysilyl benzoic acid, γ-methacryl oxypropyl trimethoxysilane, vinyl triacetoxysilane, vinyl trimethoxysilane, γ-iso cyanate propyl triethoxysilane, γ-glycidoxy propyl trimethoxysilane, β-(3,4-epoxycyclohexyl)ethyltrimethoxysilane, and the like. These may be used singularly or as a mixture of two or more.

The silane-coupling agent may be included in an amount of about 0.01 parts by weight to about 10 parts by weight based on about 100 parts by weight of the photosensitive resin composition. When the silane-coupling agent is included in an amount within the above range, close contacting property, storing property, and the like may be excellent.

In addition, the photosensitive resin composition may further include a surfactant to improve coating and prevent a defect if necessary.

Examples of the surfactant may include without limitation commercial fluorine-based surfactants such as BM-1000® and BM-1100® (BM Chemie Inc.); MEGAFACE F 142D®, F 172®, F 173®, and F 183® (Dainippon Ink Kagaku Kogyo Co., Ltd.); FULORAD FC-135®, FULORAD FC-170C®, FULORAD FC-430®, and FULORAD FC-431® (Sumitomo 3M Co., Ltd.); SURFLON S-112®, SURFLON S-113®, SURFLON S-131®, SURFLON S-141®, and SURFLON S-145® (Asahi Glass Co., Ltd.); SH-28PA®, SH-190®, SH-193®, SZ-6032®, and SF-8428® (Toray Silicone Co., Ltd.) and the like, and combinations thereof.

The surfactant may be used in an amount of about 0.001 parts by weight to about 5 parts by weight based on about 100 parts by weight of the photosensitive resin composition. When the surfactant is included in an amount within the above range, excellent wetting on a glass substrate as well as coating uniformity may be secured, but a stain may not be produced.

Furthermore, the photosensitive resin composition may include one or more other additives such as an antioxidant, a stabilizer, and the like in a predetermined amount unless they deteriorate properties of the photosensitive resin composition.

According to another embodiment of the present invention, a light blocking layer manufactured using the photosensitive resin composition is provided. The light blocking layer may be manufactured as follows.

(1) Application and Film Formation

The photosensitive resin composition can be coated to have a desired thickness, for example, a thickness ranging from about 0.5 μm to about 25 μm, on a substrate which undergoes a predetermined pretreatment, using a spin or slit coating method, a roll coating method, a screen-printing method, an applicator method, and the like. Then, the coated substrate can be heated at a temperature ranging from about 70° C. to about 110° C. for about 1 minute to about 10 minutes to remove a solvent.

(2) Exposure

The resultant film can be radiated by an active ray of about 190 nm to about 500 nm after putting a mask with a predetermined shape to form a desired pattern.

The radiation can be performed by using a light source such as a mercury lamp with a low pressure, a high pressure, or an ultra high pressure, a metal halide lamp, an argon gas laser, and the like. An X ray, an electron beam, and the like may be also used.

The exposure process can use, for example, a light dose of about 500 mJ/cm$^2$ or less (with a 365 nm sensor) when a high pressure mercury lamp is used. However, the light dose may vary depending on the kinds of each component of the photosensitive resin composition, their combination ratio, and dry film thickness.

(3) Development

After the exposure process, an alkali aqueous solution can be used to develop the exposed film by dissolving and removing an unnecessary part except the exposed part, forming an image pattern.

(4) Post-Treatment

The developed image pattern may be heated again or radiated by an active ray and the like for curing, in order to accomplish excellent quality in terms of heat resistance, photo resistance, close contacting properties, crack-resistance, chemical resistance, high strength, storage stability, and the like.

Therefore, the above photosensitive resin composition may provide a pattern that can have improved high close-contacting force and/or resolution required for a light blocking layer.

Hereinafter, the present invention is illustrated in more detail with reference to the following examples. These examples, however, are not in any sense to be interpreted as limiting the scope of the invention.

(Preparation of Cardo-Based Resin Monomer)

Preparation Example 1-1

100 g of 9,9'-bis(4-glycidoxy phenyl)fluorene (Hear Chem), 96 g of mono-2-ethyl acryloyl succinic acid, 1.4 g of benzyltriethylammoniumchloride (Daejung Chemicals & Metals Co., Ltd.), 1 g of triphenylphosphine (Aldrich Corporation), 196 g of propyleneglycol methylethylacetate (Daicel Chemical Industries, Ltd.), and 0.5 g of hydroquinone are put in a reactor, the mixture is heated up to 120° C. and then maintained for 12 hours, obtaining a solution in which 50 wt % of a compound represented by the following Chemical Formula 8-1 is dissolved (based on the total amount of the solution).

[Chemical Formula 8-1]

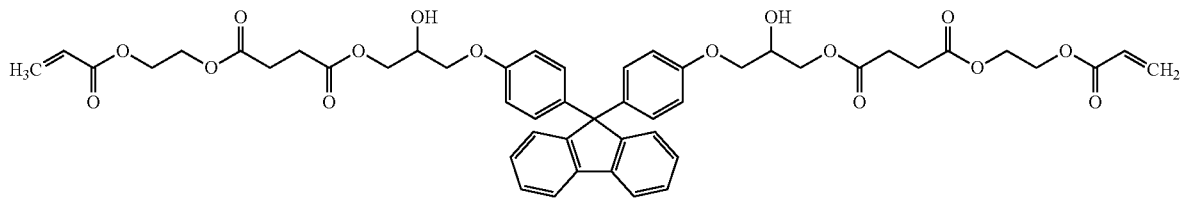

Preparation Example 1-2

(1) 50 g of 6-hydroxy hexanoic acid (Acros Organics) and 39 g of triethylamine (Aldrich Corporation) are dissolved in 200 g of methylene chloride (Daejung Chemicals & Metals Co., Ltd.) in a reactor, the solution is cooled down to 5° C. and then maintained at the same temperature, 35 g of acryloyl chloride (Aldrich Corporation) is slowly added thereto for 1 hour, and the obtained mixture is heated up to 40° C. and agitated for 6 hours. The reaction solution is cooled down to room temperature, a salt produced therein is filtered and removed, and the filtered solution is distilled under a reduced pressure, synthesizing a compound represented by the following Chemical Formula 8-2.

[Chemical Formula 8-2]

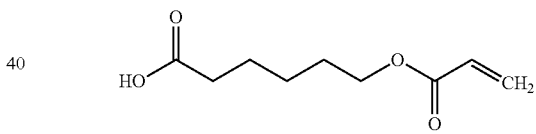

(2) 100 g of 9,9'-bis(4-glycidoxy phenyl) fluorene (Hear Chem), 83 g of a compound represented by the above Chemical Formula 8-2, 1.4 g of benzyltriethylammonium chloride (Daejung Chemicals & Metals Co., Ltd.), 1 g of triphenylphosphine (Aldrich Corporation), 183 g of propyleneglycol methylethylacetate (Daicel Chemical Industries, Ltd.), and 0.5 g of hydroquinone are put in a reactor, the mixture is heated up to 120° C. and then maintained for 12 hours, obtaining a solution in which 50 wt % of a compound represented by the following Chemical Formula 8-3 is dissolved (based on the entire amount of the solution).

[Chemical Formula 8-3]

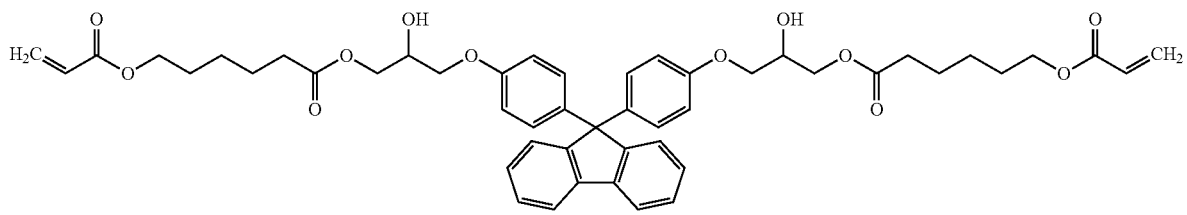

(Preparation of Cardo-Based Resin)

Preparation Example 2-1

100 g of the novel cardo-based monomer solution according to Preparation Example 1-1, 8.22 g of biphenyl diacid anhydride (Mitsubishi Chemical Co.), and 2.28 g of tetrahydrophthalicacid anhydride (Aldrich Corporation) are put in a reactor, and the mixture is heated up to 120° C. and agitated for 9 hours, obtaining a polymer including a repeating unit represented by the following Chemical Formula 8-4 and having a weight average molecular weight of 5,300 g/mol.

[Chemical Formula 8-4]

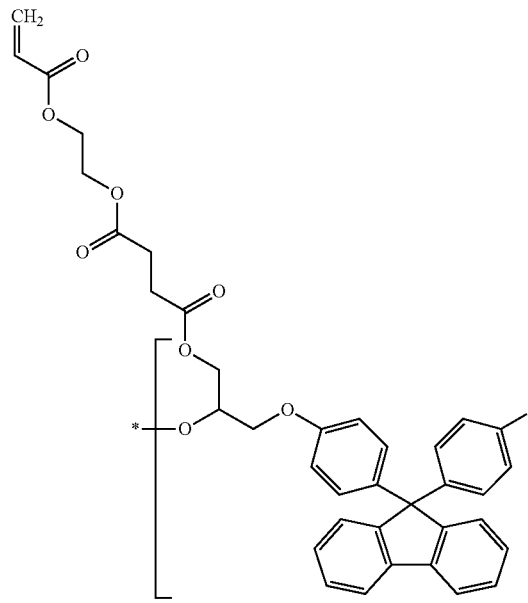
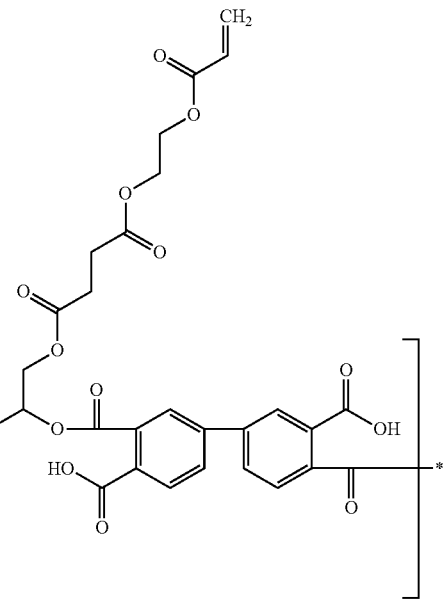

Preparation Example 2-2

100 g of the new cardo-based monomer solution according to Preparation Example 1-2, 8.22 g of biphenyldiacid anhydride (Mitsubishi Chemical Co.), and 2.28 g of tetrahydrophthalicacid anhydride (Aldrich Corporation) are put in a reactor, and the mixture is heated up to 120° C. and agitated for 9 hours, obtaining a polymer including a repeating unit represented by the following Chemical Formula 8-5 and having a weight average molecular weight of 5,100 g/mol.

[Chemical Formula 8-5]

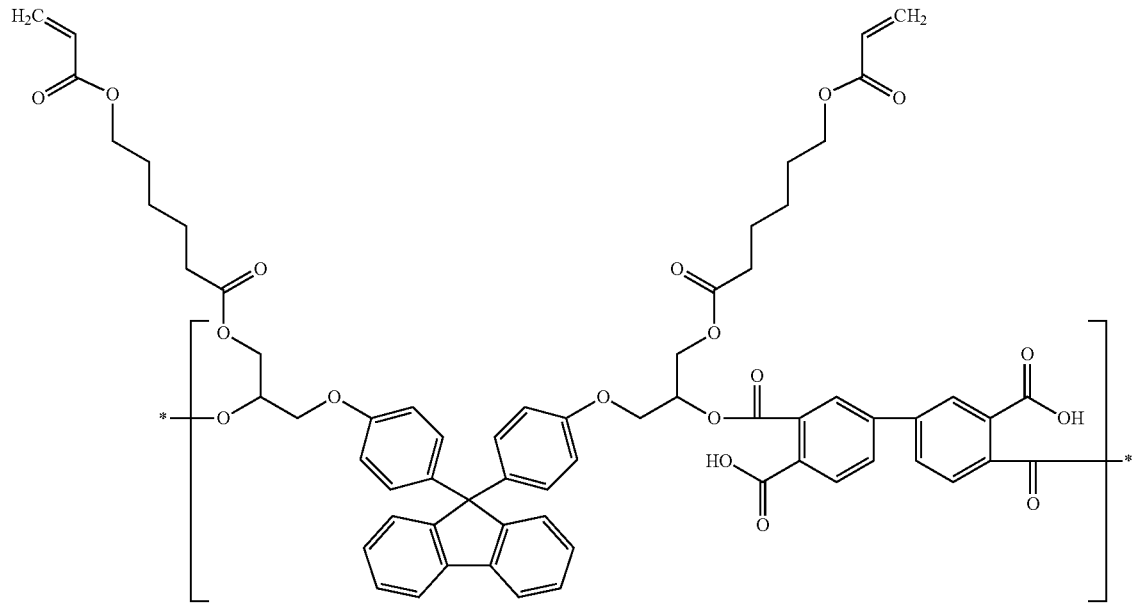

Preparation Example 2-3

100 g of the polymer solution according to Preparation Example 2-1, 2 g of butyl glycidyl ether (Aldrich Corporation), and 0.2 g of triphenylphosphine (Aldrich Corporation) are put in a reactor, the mixture is heated up to 100° C. and maintained for 9 hours, obtaining a compound in which repeating units represented by the above Chemical Formula 8-4 and the following Chemical Formula 8-6 are present together. The weight average molecular weight of the compound represented by Chemical Formula 8-6 is 5,700 g/mol.

[Chemical Formula 8-6]

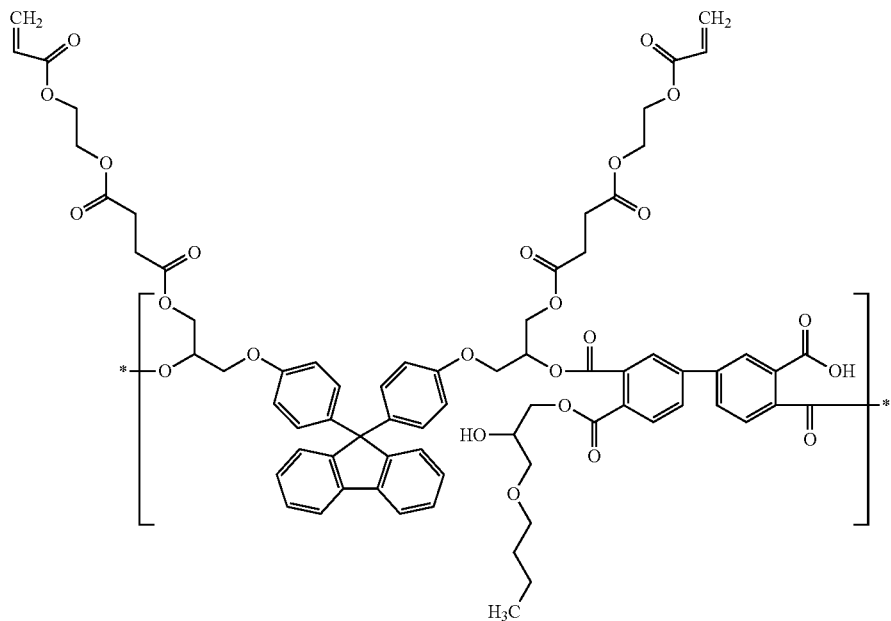

Preparation Example 2-4

100 g of the polymer solution according to Preparation Example 2-1, 2 g of glycidyl methacrylate (Aldrich Corporation), and 0.2 g of triphenylphosphine (Aldrich Corporation) are put in a reactor, the mixture is heated up to 100° C. and maintained for 9 hours, obtaining a compound in which repeating units represented by the above Chemical Formula 8-4 and the following Chemical Formula 8-7 are present together. The weight average molecular weight of the compound represented by Chemical Formula 8-7 is 5,700 g/mol.

[Chemical Formula 8-7]

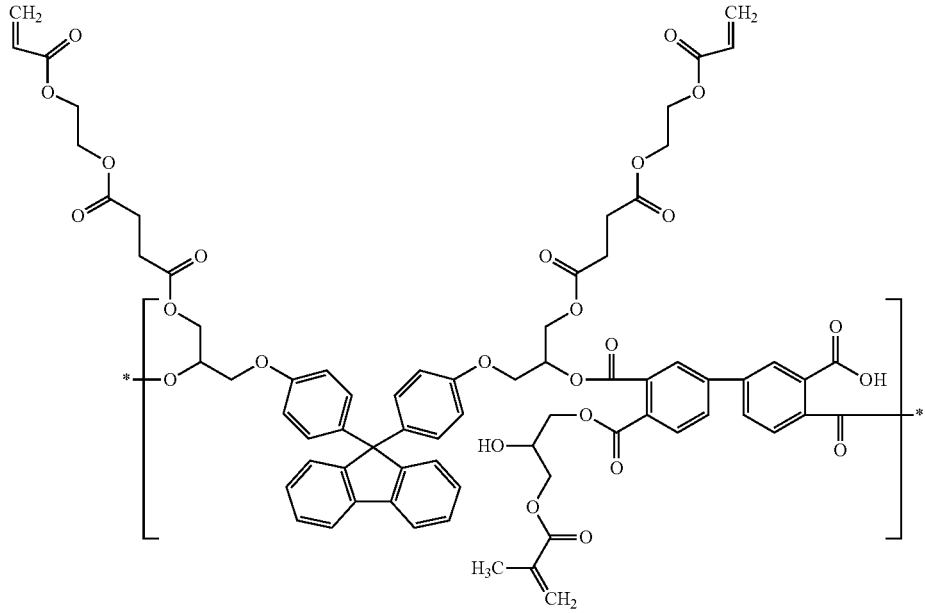

Preparation Example 2-5

100 g of the polymer solution according to Preparation Example 2-2, 2 g of KBE-9007 (Shinetsu Chemical Co., Ltd.), and 0.2 g of triphenylphosphine (Aldrich Corporation) are in a reactor, the mixture is heated up to 100° C. and maintained for 9 hours, obtaining a compound in which repeating units represented by the above Chemical Formula 8-5 and the following Chemical Formula 8-8 are present together. The weight average molecular weight of the compound represented by Chemical Formula 8-8 is 6,100 g/mol.

[Chemical Formula 8-8]

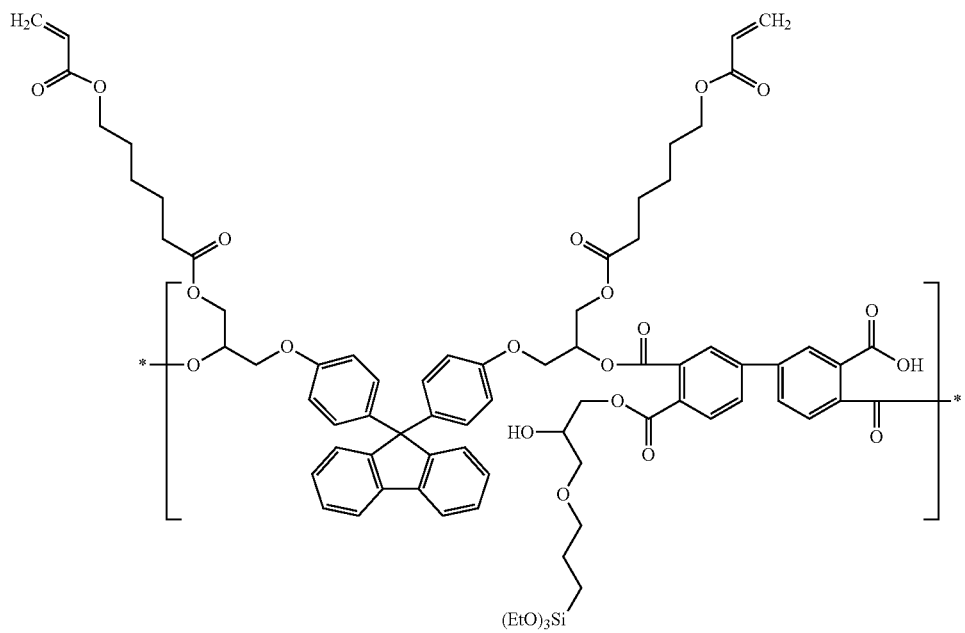

Preparation Example 2-6

(1) 25 g of diethylvinylphsophonate (Aldrich Corporation), 11.3 g of glycidol (Aldrich Corporation), and 9.9 g of cesiumcarbonate (Aldrich Corporation) are put in a reactor, the mixture is reacted at 50° C. for 5 hours and cooled down to room temperature, the reaction solution is added to 200 g of water, the mixture is extracted with 300 g of methylenechloride (Aldrich Corporation) and distiliated under a reduced pressure, and the obtained solution is treated through silica gel column, obtaining a compound represented by the following Chemical Formula 8-9 (a phosphorus-based epoxy compound for grafting).

[Chemical Formula 8-9]

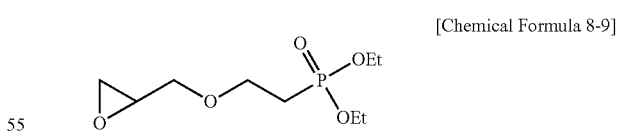

(2) 100 g of the polymer solution according to Preparation Example 2-2, 2 g of the compound represented by the above Chemical Formula 8-9, and 0.2 g of triphenylphosphine (Aldrich Corporation) are put in a reactor, and the mixture is heated up to 100° C. and maintained for 9 hours, obtaining a compound in which repeating units represented by the above Chemical Formula 8-5 and the following Chemical Formula 8-10 are present together. The weight average molecular weight of the compound represented by Chemical Formula 8-10 is 5.500 g/mol.

[Chemical Formula 8-10]

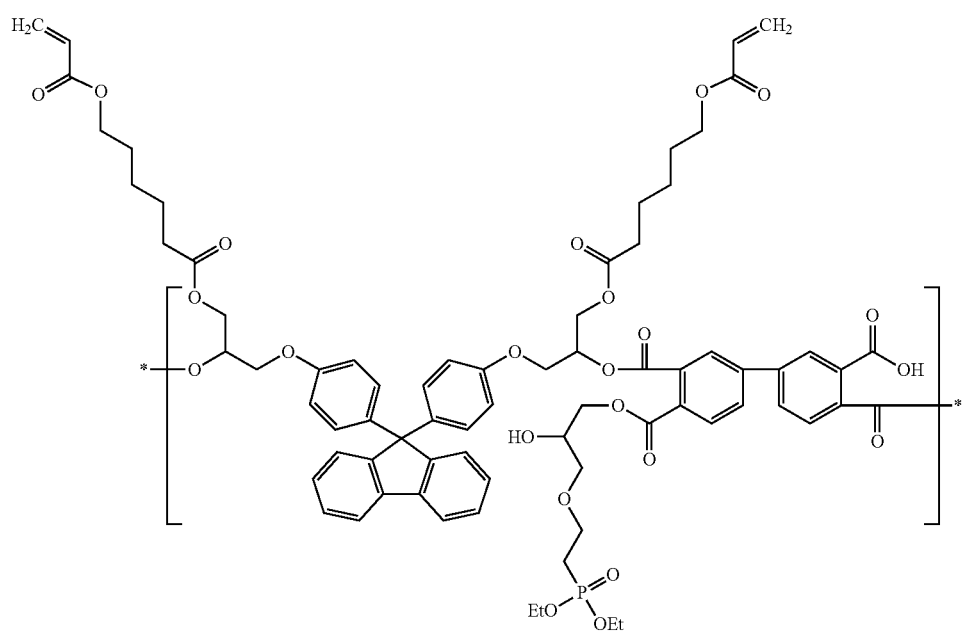

(Preparation of Pigment Dispersion)

Preparation Example 3

Preparation of Black Pigment Dispersion 15 g of carbon black (VULCAN® XC72R, Cabot Creanery Co.), 4 g of DISPERBYK-163 (BYK), 3 g of an acrylic acid/benzylmethacrylate copolymer (NPR8000, Miwon Commercial Co., Ltd.), and 78 g of propylene glycol methylethylacetate are put in a reactor, and the mixture is dispersed by using a paint-shaker (Asada Iron Works Co., Ltd.) for 12 hours, preparing a black pigment dispersion.

(Preparation of Photosensitive Resin Composition)

Examples 1 to 6 and Comparative Example 1

Each photosensitive resin composition according to Examples 1 to 6 and Comparative Example 1 is prepared using the following components in the following Table 1.

Specifically, an initiator is dissolved in a solvent, the solution is agitated at room temperature for 2 hours, a binder resin and a reactive unsaturated compound are added thereto, and the mixture is agitated at room temperature for 2 hours. Subsequently, the black pigment dispersion according to Preparation Example 3 and a silane coupling agent are added to the reactant, and the mixture is agitated at room temperature for one hour. Subsequently, the product is three times filtered to remove impurities therein, preparing a photosensitive resin composition.

(A) Binder Resin (A-1) The compound represented by Chemical Formula 8-4 according to Preparation Example 2-1 as a cardo-based resin is used.

(A-2) The compound represented by Chemical Formula 8-5 according to Preparation Example 2-2 as a cardo-based resin is used.

(A-3) The compound represented by Chemical Formula 8-6 according to Preparation Example 2-3 as a cardo-based resin is used.

(A-4) The compound represented by Chemical Formula 8-7 according to Preparation Example 2-4 as a cardo-based resin is used.

(A-5) The compound represented by Chemical Formula 8-8 according to Preparation Example 2-5 as a cardo-based resin is used.

(A-6) The compound represented by Chemical Formula 8-10 according to Preparation Example 2-6 as a cardo-based resin is used.

(A-7) V259ME made by Nippon Steel Chemical Co., Ltd. as a cardo-based resin is used.

(B) Reactive Unsaturated Compound

Dipentaerythritol hexaacrylate is used.

(C) Pigment Dispersion

The black pigment dispersion according to Preparation Example 3 is used. Herein, a pigment solid is included in an amount of 15 wt % based on the total amount of the black pigment dispersion.

(D) Initiator

IRGACURE OXE02 made by Ciba-Geigy Co. is used.

(E) Solvent

Propylene glycol methylether acetate is used.

(F) Additive

γ-glycidoxy propyl trimethoxysilane (S-510, Chisso Co.) as a silane coupling agent is used.

TABLE 1

(unit: wt %)

| | | Examples | | | | | | Comparative Examples |
|---|---|---|---|---|---|---|---|---|
| | | 1 | 2 | 3 | 4 | 5 | 6 | 1 |
| (A) Binder resin | (A-1) | 9.5 | — | — | — | — | — | — |
| (solid 50% | (A-2) | — | 9.5 | — | — | — | — | — |
| conversion) | (A-3) | — | — | 9.5 | — | — | — | — |
| | (A-4) | — | — | — | 9.5 | — | — | — |
| | (A-5) | — | — | — | — | 9.5 | — | — |
| | (A-6) | — | — | — | — | — | 9.5 | — |
| | (A-7) | — | — | — | — | — | — | 9.5 |
| (B) Reactive unsaturated compound | | 3.5 | 3.5 | 3.5 | 3.5 | 3.5 | 3.5 | 3.5 |
| (C) Pigment dispersion | | 40 (6*) | 40 (6*) | 40 (6*) | 40 (6*) | 40 (6*) | 40 (6*) | 40 (6*) |
| (D) Initiator | | 0.8 | 0.8 | 0.8 | 0.8 | 0.8 | 0.8 | 0.8 |
| (E) Solvent | | 43.7 | 43.7 | 43.7 | 43.7 | 43.7 | 43.7 | 43.7 |
| (F) Additive | | 2.5 | 2.5 | 2.5 | 2.5 | 2.5 | 2.5 | 2.5 |

(*indicates the solid content of a pigment based on the total weight of a black pigment dispersion)

Evaluation 1: Resolution Evaluation

The photosensitive resin compositions according to Examples 1 to 6 and Comparative Example 1 are respectively coated to be 1.2 μm high on a 10 cm*10 cm glass with a spin-coater (Opticoat MS-A150, Mikasa Co., Ltd.), soft-baked at 100° C. for 120 seconds on a hot-plate, and exposed with 80 mJ by using an exposer (HB-50110 AA, Ushio Inc.) and a photo mask. Subsequently, the coated glass is developed in a 0.043 wt % potassium hydroxide (KOH) aqueous solution by using a developer (SSP-200, SVS Corp.) and hard-baked at 230° C. in an oven for 30 minutes, obtaining a patterned glass specimen. Then, CD (Critical dimension) of the patterns having a thickness of greater than or equal to 1.1 μm in the glass specimen is examined with an optical microscope to pick a sample exhibiting the finest line width, and the results are provided in the following Table 2.

Evaluation 2: Close-Contacting Force

The photosensitive resin compositions according to Examples 1 to 6 and Comparative Example 1 are respectively coated to be 1.2 μm high on a 10 cm*10 cm glass by using a spin coater (Opticoat MS-A150, Mikasa Co., Ltd.), soft-baked at 100° C. on a hot-plate for 130 seconds, and exposed with 40 mJ by using an exposer (HB-50110AA, Ushio Inc.) and a photo mask. Subsequently, the coated glasses are developed in a 0.043 wt % potassium hydroxide (KOH) aqueous solution by using a developer (SSP-200, SVS Corp.) and hard-baked at 230° C. in an oven for 30 minutes, obtaining a patterned glass specimen. These specimens are cut into a size of 2 cm*2 cm, a Stud pin is fixed on the cut specimen with a Mount clip, and the Mount clip is removed after fixing the Stud pin and the glass specimen by heated them at 120° C. of 30 minutes in an oven. Close-contacting forces of the specimens are evaluated by using UTM (Inspekt 10-1, Hegewald&Peschke), and the results are provided in the following Table 2.

TABLE 2

| | Minimum pattern size (resolution) (μm) | Close-contacting force to substrate (N) |
|---|---|---|
| Example 1 | 7.4 | 311 |
| Example 2 | 7.2 | 319 |
| Example 3 | 7.6 | 316 |
| Example 4 | 7.1 | 306 |
| Example 5 | 7.0 | 305 |
| Example 6 | 6.9 | 315 |
| Comparative Example 1 | 8.9 | 171 |

Referring to Table 2, the photosensitive resin compositions according to Examples 1 to 6 prepared by respectively using the cardo-based resins according to Preparation Example 2-1 to 2-6 exhibit a finer line width and thus, a higher close-contacting force than the photosensitive resin composition according to Comparative Example 1.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

What is claimed is:

1. A photosensitive resin composition, comprising:
   (A) a cardo-based resin including a repeating unit represented by the following Chemical Formula 1;
   (B) a reactive unsaturated compound;
   (C) a pigment;
   (D) an initiator; and
   (E) a solvent:

[Chemical Formula 1]

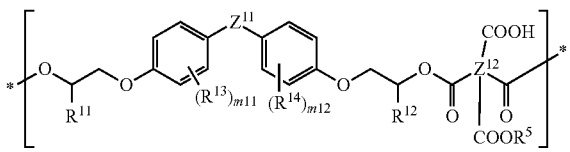

wherein, in the above Chemical Formula 1,
$R^{11}$ and $R^{12}$ are the same or different and are each independently a substituent represented by the following Chemical Formula 2-1 or 2-2, $R^{13}$ and $R^{14}$ are the same or different and are each independently hydrogen, halogen, or substituted or unsubstituted C1 to C20 alkyl, $R^5$ is hydrogen or a substituent represented by the following Chemical Formula 3, $Z^{11}$ is a single bond, O, CO, $SO_2$, $CR^6R^7$, $SiR^8R^9$ wherein $R^6$ to $R^9$ are the same or different and are each independently hydrogen or substituted or unsubstituted C1 to C20 alkyl, or one of linking groups represented by the following Chemical Formulae 4-1 to 4-11, $Z^{12}$ is an acid anhydride residual group or an acid dianhydride residual group, and m11 and m12 are the same or different and are each independently integers ranging from 0 to 4,

[Chemical Formula 2-1]

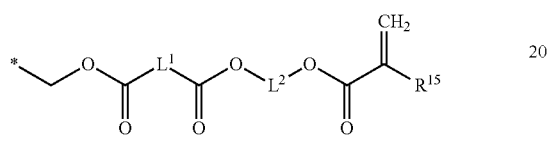

[Chemical Formula 2-2]

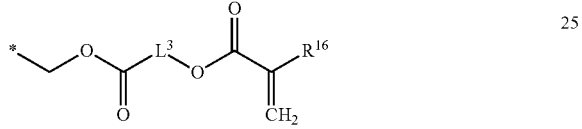

[Chemical Formula 3]

wherein, in the above Chemical Formulae 2-1 and 2-2, $L^1$ to $L^3$ are the same or different and are each independently a single bond, substituted or unsubstituted C1 to C30 alkylene, or substituted or unsubstituted C6 to C30 arylene, and $R^{15}$ and $R^{16}$ are the same or different and are each independently hydrogen or substituted or unsubstituted C1 to C12 alkyl, in the above Chemical Formula 3, $R^{17}$ is substituted or unsubstituted C1 to C30 alkyl or a substituted or unsubstituted (meth)acrylate group,

[Chemical Formula 4-1]

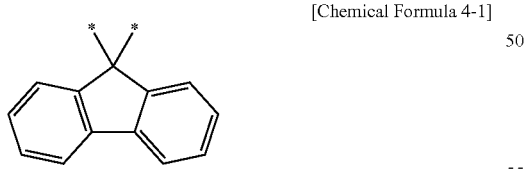

[Chemical Formula 4-2]

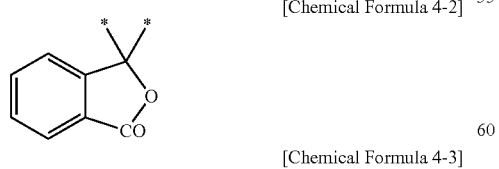

[Chemical Formula 4-3]

[Chemical Formula 4-4]

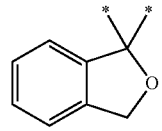

[Chemical Formula 4-5]

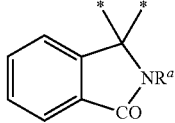

wherein, in the above Chemical Formula 4-5, $R^a$ is hydrogen, ethyl, $C_2H_4Cl$, $C_2H_4OH$, $CH_2CH=CH_2$, or phenyl,

[Chemical Formula 4-6]

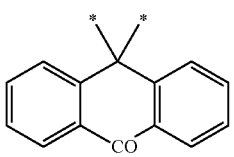

[Chemical Formula 4-7]

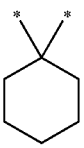

[Chemical Formula 4-8]

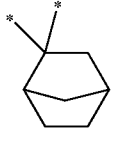

[Chemical Formula 4-9]

[Chemical Formula 4-10]

[Chemical Formula 4-11]

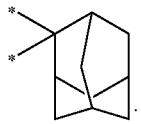

2. The photosensitive resin composition of claim 1, wherein the above Chemical Formula 3 is represented by one of the following Chemical Formulae 5-1 to 5-4:

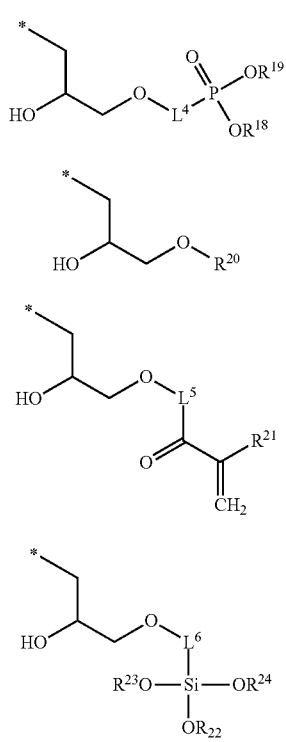

[Chemical Formula 5-1]

[Chemical Formula 5-2]

[Chemical Formula 5-3]

[Chemical Formula 5-4]

wherein, in the above Chemical Formulae 5-1 to 5-4,
$L^4$ to $L^6$ are the same or different and are each independently a single bond, substituted or unsubstituted C1 to C30 alkylene, or substituted or unsubstituted C6 to C30 arylene, and
$R^{18}$ to $R^{24}$ are the same or different and are each independently substituted or unsubstituted C1 to C30 alkyl.

3. The photosensitive resin composition of claim 1, wherein the cardo-based resin has a weight average molecular weight of about 500 to about 50,000 g/mol.

4. The photosensitive resin composition of claim 1, wherein the cardo-based resin comprises a terminal group represented by the following Chemical Formula 6 at at least one of both terminal ends:

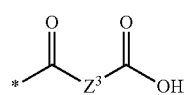

[Chemical Formula 6]

wherein, in the above Chemical Formula 6,
$Z^3$ is a linking group represented by the following Chemical Formulae 7-1 to 7-7:

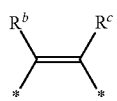

[Chemical Formula 7-1]

wherein, in the above Chemical Formula 7-1,
$R^b$ and $R^c$ are the same or different and are each independently hydrogen, substituted or unsubstituted C1 to C20 alkyl, an ester group, or an ether group,

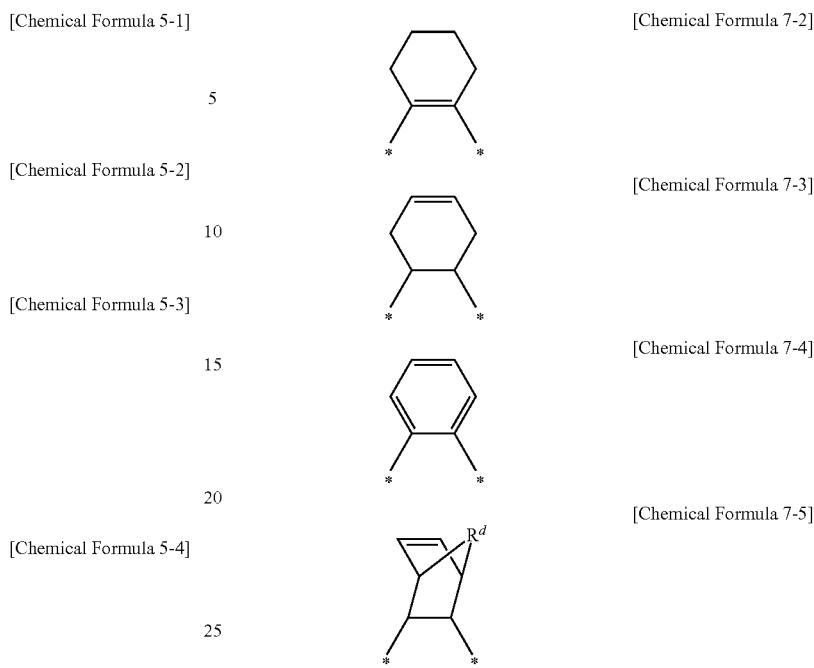

[Chemical Formula 7-2]

[Chemical Formula 7-3]

[Chemical Formula 7-4]

[Chemical Formula 7-5]

wherein, in the above Chemical Formula 7-5,
$R^d$ is O, S, NH, substituted or unsubstituted C1 to C20 alkylene, C1 to C20 alkylamine group, or C2 to C20 allylamine group,

[Chemical Formula 7-6]

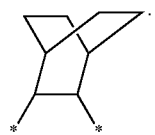

[Chemical Formula 7-7]

5. The photosensitive resin composition of claim 1, wherein the photosensitive resin composition comprises:
about 1 wt % to about 30 wt % of the cardo-based resin (A);
about 1 wt % to about 40 wt % of the reactive unsaturated compound (B);
about 1 wt % to about 50 wt % of the pigment (C);
about 0.01 wt % to about 10 wt % of the initiator (D); and
a balance amount of the solvent (E).

6. The photosensitive resin composition of claim 1, wherein the photosensitive resin composition further comprises an acrylic-based resin.

7. The photosensitive resin composition of claim 6, wherein the acrylic-based resin is a copolymer of a first ethylenic unsaturated monomer comprising (meth)acrylic acid, maleic acid, itaconic acid, fumaric acid, or a combination thereof; and a second ethylenic unsaturated monomer comprising styrene, α-methylstyrene, vinyltoluene, vinylbenzylmethylether, methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl (meth)acrylate, phenyl(meth)acrylate, 2-aminoethyl(meth) acrylate, 2-dimethylaminoethyl(meth)acrylate, vinyl acetate, vinyl benzoate, glycidyl(meth)acrylate, (meth)acrylonitrile, (meth)acrylamide, or a combination thereof.

8. The photosensitive resin composition of claim 6, wherein the acrylic-based resin has a weight average molecular weight of about 3,000 g/mol to about 40,000 g/mol.

9. The photosensitive resin composition of claim 6, wherein the cardo-based resin and the acrylic-based resin are included in a weight ratio of about 99:1 to about 30:70.

10. The photosensitive resin composition of claim 1, wherein the initiator comprises a photopolymerization initiator, a radical polymerization initiator, or a combination thereof.

11. The photosensitive resin composition of claim 1, wherein the photosensitive resin composition further comprises about 0.01 to about 20 parts by weight of an epoxy compound based on about 100 parts by weight of the photosensitive resin composition.

12. A light blocking layer manufactured by the process of:
coating a substrate with the photosensitive resin composition of claim 1;
heating the coated substrate to form a film on the substrate;
exposing the film to radiation to form a pattern; and
developing the exposed film.

\* \* \* \* \*